United States Patent
Asagiri et al.

(10) Patent No.: US 6,315,856 B1
(45) Date of Patent: Nov. 13, 2001

(54) METHOD OF MOUNTING ELECTRONIC COMPONENT

(75) Inventors: Satoru Asagiri, Hachioji; Masayoshi Yamaguchi, Kokubunji, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/271,912

(22) Filed: Mar. 18, 1999

(30) Foreign Application Priority Data

Mar. 19, 1998 (JP) .................................................. 10-070460
Mar. 19, 1998 (JP) .................................................. 10-070461

(51) Int. Cl.⁷ .............................. B32B 31/26; H05K 3/32
(52) U.S. Cl. ................... 156/277; 156/306.6; 156/306.9; 29/832
(58) Field of Search .................................... 156/277, 292, 156/578, 306.6, 306.9; 29/832

(56) References Cited

U.S. PATENT DOCUMENTS

| | | | |
|---|---|---|---|
| 5,120,665 | * | 6/1992 | Tsukagoshi et al. . |
| 5,123,986 | * | 6/1992 | Sugiyama et al. . |
| 5,283,947 | * | 2/1994 | Santo et al. ........................ 29/832 X |
| 5,328,087 | * | 7/1994 | Nelson et al. . |
| 5,637,176 | * | 6/1997 | Gilleo et al. ........................ 156/277 |
| 5,661,042 | * | 8/1997 | Fang et al. . |
| 5,681,757 | * | 10/1997 | Hayes . |
| 5,839,188 | * | 11/1998 | Pommer . |
| 5,843,251 | * | 12/1998 | Tsukagoshi et al. ............... 29/832 X |
| 6,077,382 | * | 6/2000 | Watanabe ............................. 29/832 X |

FOREIGN PATENT DOCUMENTS

| | | | |
|---|---|---|---|
| 62-243668 | * | 10/1987 | (JP) . |
| 1-196844 | * | 8/1989 | (JP) . |
| 3-112011 | * | 5/1991 | (JP) . |
| 3-219691 | * | 9/1991 | (JP) . |
| 3-285977 | * | 12/1991 | (JP) . |
| 4-30593 | * | 2/1992 | (JP) . |
| 7-37913 | * | 2/1995 | (JP) . |

OTHER PUBLICATIONS

Definition of "condensing agent" from glossary from several sources, 2000.*

* cited by examiner

Primary Examiner—Curtis Mayes
(74) Attorney, Agent, or Firm—Finnegan, Henderson, Farabow, Garrett & Dunner, L.L.P.

(57) ABSTRACT

In a method of mounting an electronic component by connecting leads of an electronic component and electrodes on a printed circuit board using isotropic conductive adhesive comprising a resin-based binder mixed with filler, the isotropic conductive adhesive is supplied to the electrodes on the printed circuit board by an ink jet type adhesive coating device. Also, in a method of mounting an electronic component by connecting leads of an electronic component and electrodes on a printed circuit board using isotropic conductive adhesive comprising conductive high polymer material, the isotropic conductive adhesive is supplied to the electrodes on the printed circuit board by an ink jet adhesive coating device. Also, in a method of mounting an electronic component by connecting leads of an electronic component and electrodes on a printed circuit board using anisotropic conductive adhesive comprising a resin-based binder mixed with filler, the electronic component is mounted on the printed circuit board using the anisotropic conductive adhesive which shrinks and cures by heating so as to electrically and mechanically connect the leads and electrodes.

5 Claims, 13 Drawing Sheets

METHOD OF MOUNTING ELECTRONIC COMPONENT

BACKGROUND OF THE INVENTION

1. Field of the Invention

The present invention relates to a method of mounting an electronic component by connecting an electronic component to a printed circuit board using isotropic conductive adhesive, and a method of mounting an electronic component by connecting an electronic component to a printed circuit board using anisotropic conductive adhesive.

2. Description of the Related Art

A conventional method of connecting an electronic component to a printed circuit board is a reflow mounting method using solder paste, in which leads of the electronic component and electrodes on the printed circuit board are connected in such a manner that solder paste is printed on the electrodes on the printed circuit board through a metal mask, then the electronic component is placed on the printed circuit board, and the solder paste on the electrodes is heated and melted in a reflow furnace.

Recently, however, it has been pointed out that the lead component contained in solder paste in the above mentioned method of mounting an electronic component using solder paste causes negative influences on the human body and the global environment.

As a measure to prevent the various negative influences by the lead component of the solder paste, a method of connecting an electronic component on a printed circuit board has been provided using isotropic conductive adhesive comprising a resin-based binder mixed with filler in place of the solder paste.

In this method using isotropic conductive adhesive containing a resin-based binder, a printed circuit board and an electronic component can be connected through the same steps as in the reflow mounting method using solder paste.

However, this mounting method using isotropic conductive adhesive requires the printing of the isotropic conductive adhesive on the printed circuit board via a metal mask, manufacturing the metal mask and printing step are indispensable. Therefore, no improvement has been made by this method in connection with the complicated mounting step of an electronic component and the complexity of working facilities.

Further, since this mounting method using isotropic conductive adhesive requires the printing of the isotropic conductive adhesive on the printed circuit board via a metal mask, the distance between adjacent printing areas cannot be too small, and also it is difficult to connect to so called "high-density fine-pitch an electronic component having the lead pitch of 0.3 mm or less, for example.

Accordingly, it is an object of the present invention to provide a method of mounting an electronic component on a printed circuit board using an isotropic conductive adhesive, whereby the negative influence of the lead component in the adhesive on the human body and the global environment is prevented, and a high-density fine-pitch electronic component can be connected on the printed circuit board without requiring complicated steps and complex equipment.

Meanwhile, as another measure to prevent various negative influences of the lead component contained in solder paste in the method of mounting an electronic component using solder paste, a method of connecting an electronic component on a printed circuit board using anisotropic conductive adhesive comprising a resin-based binder mixed with filler in place of the solder paste, has been provided.

As is widely known, the anisotropic conductive adhesive can maintain insulation between adjacent electrodes. Therefore, a high-density fine-pitch component for which the lead pitch is 0.3 mm or less, for example, can be connected on a printed circuit board if the anisotropic conductive adhesive is used.

It is also widely known that when the connection between the components and the printed circuit board is made using anisotropic conductive adhesive, a heating step and a pressurizing step by thermo-compression bonding equipment are indispensable after supplying anisotropic conductive adhesive between the electronic component and the printed circuit board.

In other words, in the method of connecting a printed circuit board and an electronic component using anisotropic conductive adhesive, the negative influence caused by the lead component can be prevented and a high-density fine-pitch electronic component can be connected to the printed circuit board. However, since the heating step and the pressurizing step are required, there arise such problems that the connecting step will be complicated and the equipment used for the connection step will be complex.

Accordingly, it is another object of the present invention to provide a method of mounting an electronic component on a printed circuit board using anisotropic conductive adhesive, whereby the negative influence of the lead component on the human body and the global environment is prevented, and a high-density fine-pitch electronic component can be connected on the printed circuit board without requiring complicated steps and complex equipment.

SUMMARY OF THE INVENTION

In a method of mounting an electronic component in accordance with the first invention, mounting an electronic component is conducted by connecting leads of an electronic component and electrodes on a printed circuit board using isotropic conductive adhesive comprising a resin-based binder mixed with filler, wherein the isotropic conductive adhesive is supplied to the electrodes on the printed circuit board using an ink jet type adhesive coating device.

According to the above configuration, where the printed circuit board and the electronic component are connected to each other using the isotropic conductive adhesive, various problems caused by the lead component in solder paste do not occur.

Also according to the above configuration, which uses the ink jet type adhesive coating device, the isotropic conductive adhesive can be supplied to the printed circuit board without going through a printing step using a metal mask.

Also according to the above configuration, which uses the ink jet type adhesive coating device, the isotropic conductive adhesive can be supplied to the printed circuit board at an extremely small pitch.

As a consequence, according to the method of mounting an electronic component in accordance with the first invention, the negative influence of the lead component on the human body and the global environment can be prevented, and a high-density fine-pitch electronic component can be connected on the printed circuit board without requiring complicated steps and complex equipment.

In a method of mounting an electronic component in accordance with the second invention, mounting an electronic component is conducted by connecting leads of an electronic component and electrodes on a printed circuit board using isotropic conductive adhesive comprising a conductive high polymer material, wherein the isotropic conductive adhesive is supplied to the electrodes on the printed circuit board using an ink jet type adhesive coating device.

According to the above configuration, where the printed circuit board and the electronic component are connected using the isotropic conductive adhesive, various problems caused by the lead component in solder paste do not occur.

Also according to the above configuration, which uses the ink jet adhesive coating device, the isotropic conductive adhesive can be supplied to the printed circuit board without going through a printing step using a metal mask.

Also according to the above configuration, which uses the ink jet type adhesive coating device, the isotropic conductive adhesive can be supplied to the printed circuit board at an extremely small pitch.

As a consequence, according to the method of mounting an electronic component in accordance with the second invention, the negative influence of the lead component on the human body and the global environment can be prevented, and a high-density fine-pitch electronic component can be connected on the printed circuit board without requiring complicated steps and complex equipment.

In a method of mounting an electronic component in accordance with the third invention, mounting an electronic component is conducted by connecting leads of an electronic component and electrodes of a printed circuit board using anisotropic conductive adhesive comprising a resin-based binder mixed with filler, wherein the electronic component is mounted on the printed circuit board using the anisotropic conductive adhesive which shrinks and cures by heating so as to electrically and mechanically connect the leads and the electrodes.

According to the above configuration, where the anisotropic conductive adhesive material is used, a high-density fine-pitch electronic component can be connected on the printed circuit board, and various problems caused by the lead component in solder paste do not occur.

Also according to the above configuration, which connects the leads and the electrodes by heating without requiring pressure for connection of the leads and the electrodes, the electronic component can be mounted on the printed circuit board using conventional reflow mounting type equipment.

As a consequence, according to the method of mounting an electronic component in accordance with the third invention, the negative influence of the lead component on the human body and the global environment can be prevented, and a high-density fine-pitch electronic component can be connected on the printed circuit board without requiring complicated steps and complex equipment.

DESCRIPTION OF THE PREFERRED EMBODIMENTS

The present invention will now be described with reference to the accompanying drawings.

Figure 1:
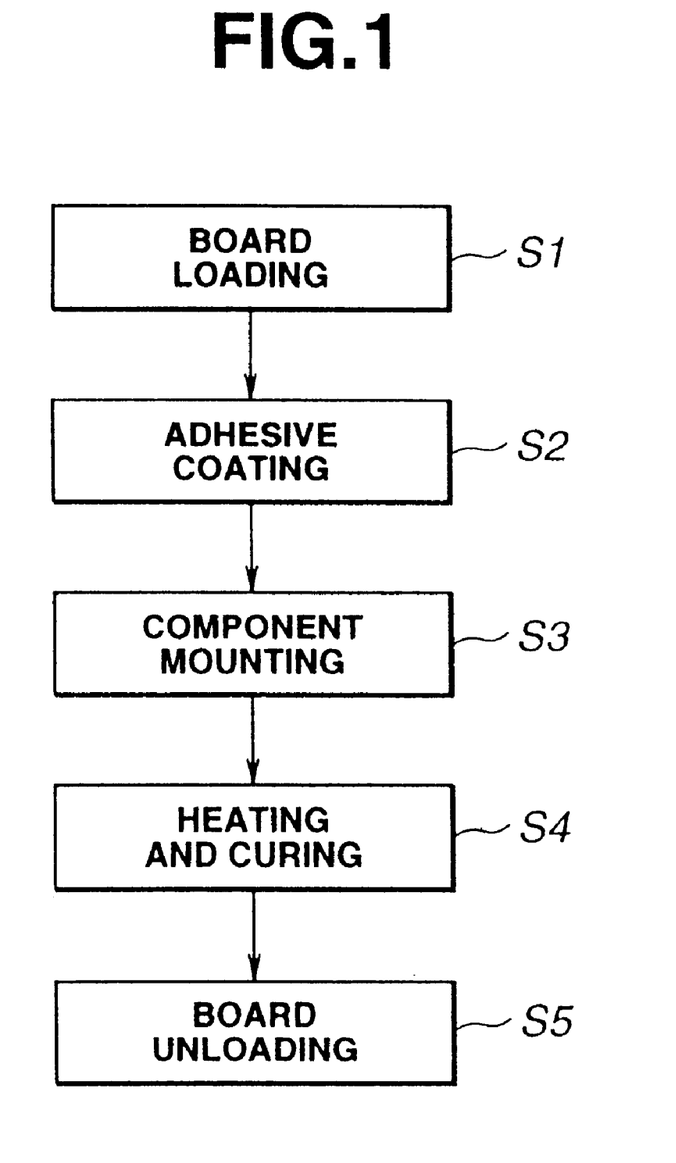
FIG. 1 is a flowchart indicating steps in a method of mounting an electronic component in accordance with the first invention.

As FIG. 1 shows, a method of mounting an electronic component in accordance with the first invention comprises a board loading step S1 where a printed circuit board is loaded from a magazine (not illustrated in the drawings) in a mounting line of a production facility (not illustrated), a coating step S2 where isotropic conductive material is supplied to electrodes on the printed circuit board, a mounting step S3 where an electronic component is mounted on a predetermined area on the printed circuit board, a reflow step S4 where the isotropic conductive adhesive is heated and cured in a reflow furnace, and a board unloading step S5 where the printed circuit board, on which the electronic component has been connected, is unloaded to the magazine (not illustrated).

Figure 2:
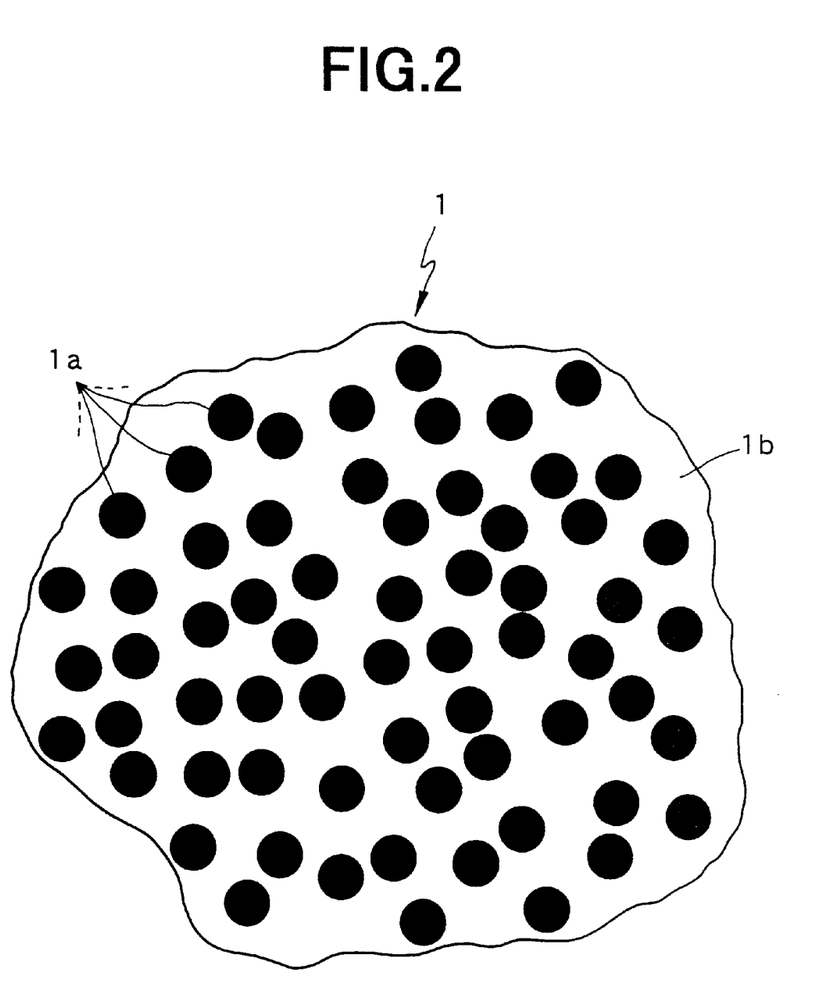
FIG. 2 is a schematic diagram depicting an isotropic conductive adhesive used for the method of mounting an electronic component in accordance with the first invention.

As FIG. 2 shows, the isotropic conductive adhesive 1 used for the coating step S2 comprises many fillers 1a, 1a, . . . mixed with a paste type epoxy resin-based binder 1b, which is widely known.

The isotropic conductive adhesive 1 has a characteristic such as sufficient flowability which allows it to be handled by a later mentioned adhesive coating device A.

Figure 3A:
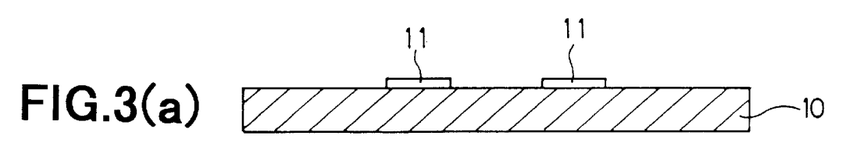
FIGS. 3(a) through 3(e) are schematic diagrams sequentially depicting the method of mounting an electronic component in accordance with the first invention.
Figure 3B:
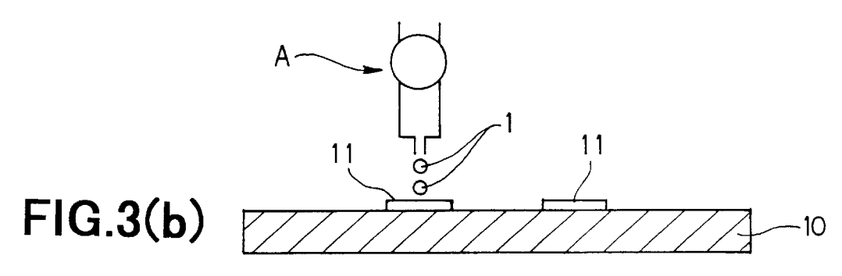

As FIG. 3(a) shows, the printed circuit board 10 is loaded into a mounting line in the board loading step S1, and in the coating step S2 shown in FIG. 3(b), the adhesive coating device A supplies the isotropic conductive adhesive 1 to the electrodes 11 on the printed circuit board 10.

The adhesive coating device A ejects the isotropic conductive adhesive in an extremely small range by a well known ink jet system used for a printer, so as to coat the isotropic conductive adhesive 1 on the surface of the electrodes 11.

In other words, according to the above mentioned ink jet type adhesive coating device A, where the isotropic conductive adhesive 1 can be supplied to the printed circuit board 10 at an extremely small pitch, the isotropic conductive adhesive 1 can be supplied to an individual electrode which is disposed on the printed circuit board at a small pitch corresponding to an individual lead of a high-density fine-pitch electronic component.

There are other types of configurations for the adhesive coating device A depending on the system for ejecting the isotropic conductive adhesive 1.

Figure 4:
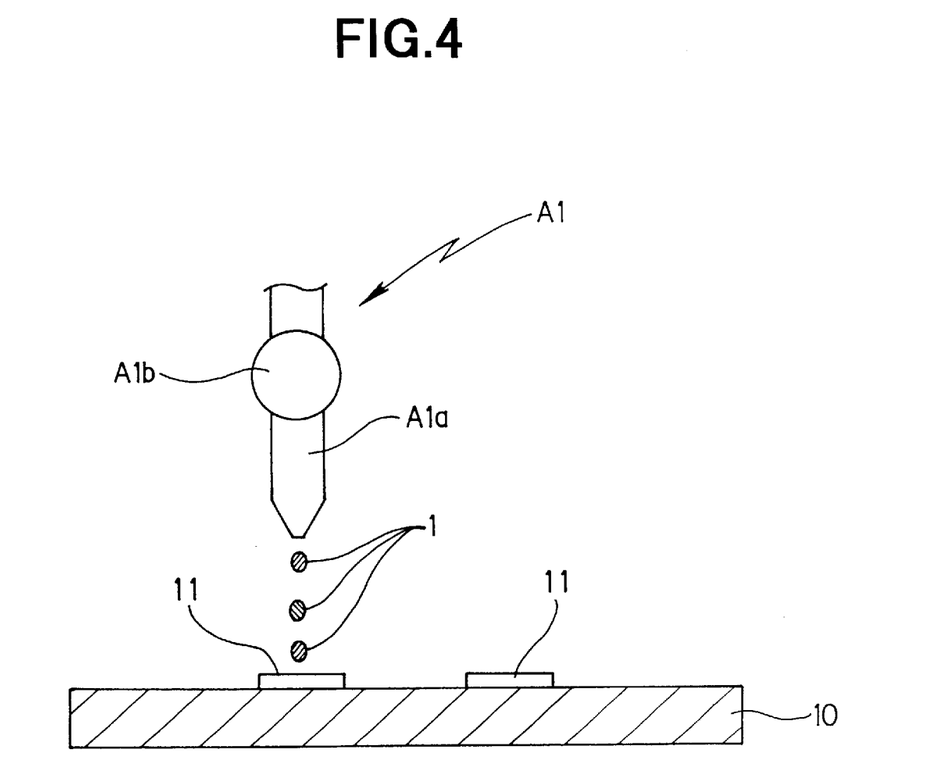
FIG. 4 is a schematic diagram depicting an adhesive coating device used for the method of mounting an electronic component in accordance with the first invention.

In an adhesive coating device A1 shown in FIG. 4, the isotropic conductive adhesive 1 is ejected by the operation of a piezoelectric element A1b disposed at a nozzle A1a.

Figure 5:
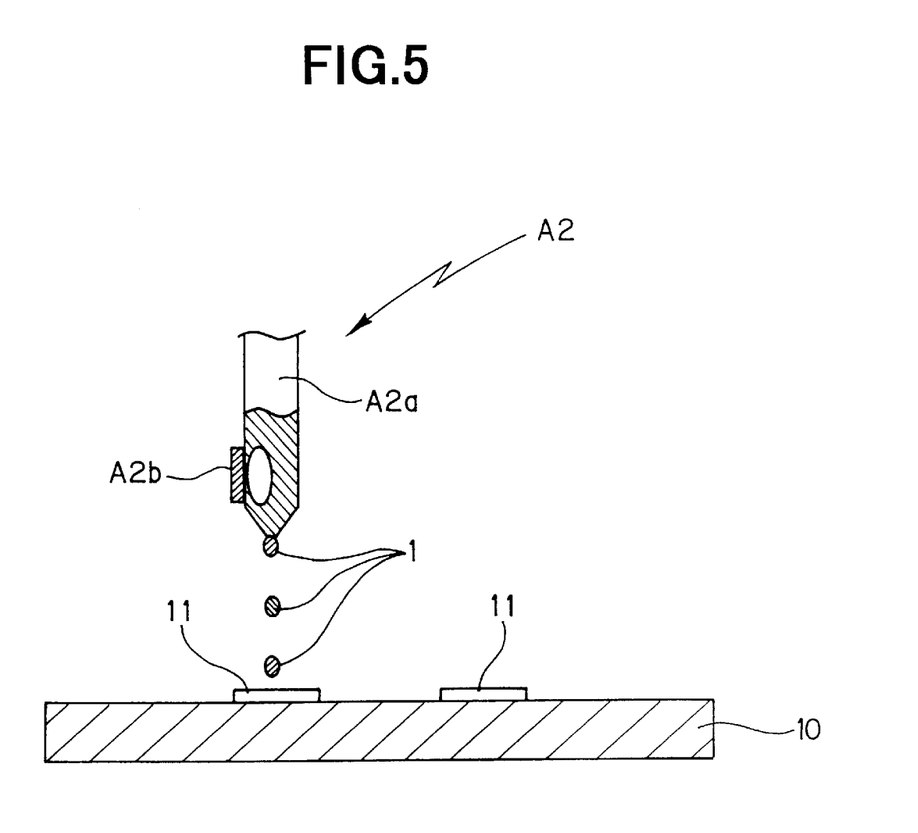
FIG. 5 is a schematic diagram depicting another adhesive coating device used for the method of mounting an electronic component in accordance with the first invention.

In an adhesive coating device A2, shown in FIG. 5, the isotropic conductive adhesive 1 is ejected by the generation of bubbles based on the operation of a heating element A2b disposed at a nozzle A2a.

Figure 6:
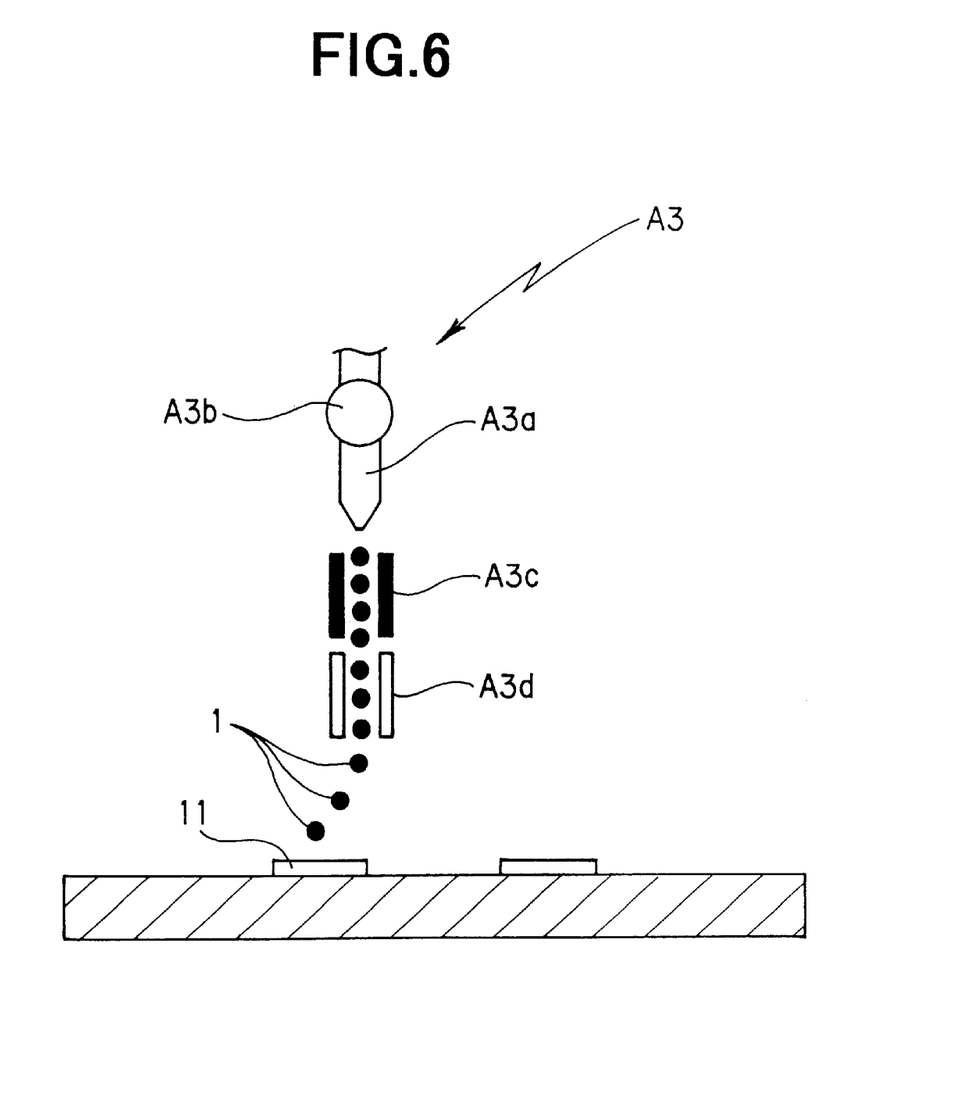
FIG. 6 is a schematic diagram depicting still another adhesive coating device used for the method of mounting an electronic component in accordance with the first invention.

In an adhesive coating device A3 shown in FIG. 6, the isotropic conductive adhesive 1 is ejected by the operation of an ultrasonic vibrator A3b disposed at a nozzle A3a, and the ejection direction of the isotropic conductive adhesive 1 charged by a charging electrode A3c is controlled by a deflecting electrode A3d.

Figure 3C:
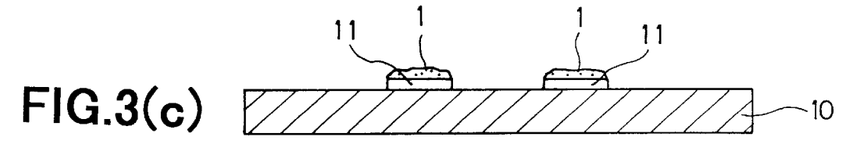
Figure 3D:
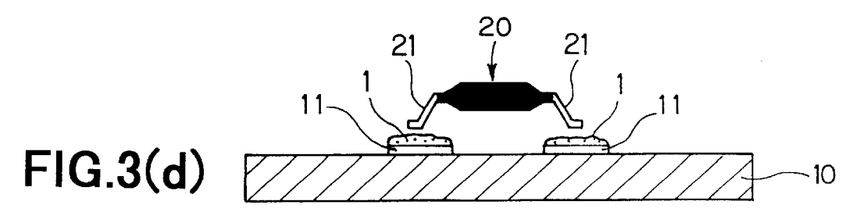

As FIGS. 3(b) and 3(c) show, the isotropic conductive adhesive 1 is supplied to the electrodes 11 on the printed circuit board 10 by the adhesive coating device A, then leads 21 of the electronic component (high-density fine-pitch electronic component) 20 are placed on the electrodes 11 to which the isotropic conductive adhesive 1 has been supplied, so as to mount the electronic component 20 at a predetermined position of the printed circuit board 10 in the mounting step S3 shown in FIG. 3(d).

Figure 3E:
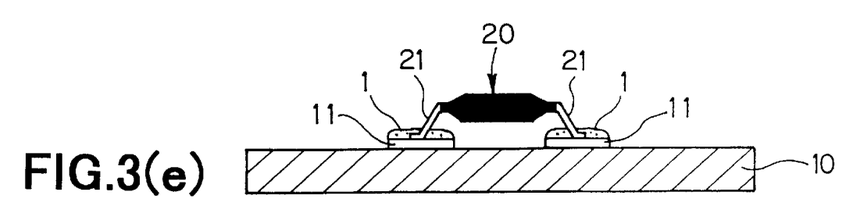

Then in the reflow step S4 shown in FIG. 3(e), the printed circuit board 10, on which the electronic component 20 has been mounted, is placed into a reflow furnace which is not illustrated, and the isotropic conductive adhesive 1 is heated and cured in the reflow furnace, so that the electrodes 11 on the printed circuit board 10 and the leads 21 of the electronic component 20 are connected to each other.

In the reflow step S4, the isotropic conductive adhesive 1 is heated from room temperature to a connection peak temperature (temperature at which strength required for connection is obtained) of the isotropic conductive adhesive 1, is then cooled down to room temperature. In this embodiment, the connection peak temperature is set at 190° C. or less, which is lower than the heating temperature when solder paste is used (approximately 200° C.), and as a result the heat load to the printed circuit board 10 and the electronic component 20 can be decreased.

As mentioned above, in the method of mounting an electronic component in accordance with the first invention, the ink jet type adhesive coating device A is used, therefore the isotropic conductive adhesive can be supplied to the printed circuit board using a metal mask without passing through the printing step, and the isotropic conductive adhesive 1 can be supplied to the printed circuit board 10 at an extremely small pitch. As a consequence a high-density fine-pitch electronic component can be mounted on the printed circuit board.

Also in the case of the method of mounting an electronic component in accordance with the first invention, the isotropic conductive adhesive is used for connection of the printed circuit board 10 and the electronic component 20. Therefore the environmental problems caused by the lead component contained in solder paste can be prevented, and a conventional facility of the reflow mounting method can be utilized.

The above embodiment illustrated an example in which the electronic component has leads which protrude from the package and these leads are connected to the electrodes on the printed circuit board. However, it is needless to say that the method of mounting an electronic component in accordance with the present invention can be effectively applied also to a flip-chip connection system, where a bare IC chip is directly connected onto a printed circuit board.

In the method of mounting an electronic component in accordance with the second invention, on the other hand, isotropic conductive adhesive comprising conductive high polymer material is used instead of the isotropic conductive adhesive comprising a resin-based binder mixed with filler as in the method of mounting an electronic component in accordance with the first invention.

This means that the method of mounting an electronic component in accordance with the second invention has the same configuration as the method of mounting an electronic component in accordance with the first invention, except for the composition of the isotropic conductive adhesive to be used.

In other words, the method of mounting an electronic component in accordance with the second invention comprises a board loading step (See S1 in FIG. 1) where a printed circuit board is loaded from a magazine in the mounting line of a production facility, a coating step (see S2 in FIG. 1) where the isotropic conductive adhesive is supplied to electrodes on the printed circuit board, a mounting step (see S3 in FIG. 1) where an electronic component is mounted on a predetermined area on the printed circuit board, a reflow step (see S4 in FIG. 1) where the isotropic conductive adhesive is heated and cured in a reflow furnace, and a board unloading step (see S5 in FIG. 1) where the printed circuit board on which the electronic component has been connected is unloaded to a magazine.

Needless to say, the isotropic conductive adhesive comprising conductive high polymer material has a characteristic which allows it to be handled by an ink jet type adhesive coating device (see A1 in FIG. 4, A2 in FIG. 5 and A3 in FIG. 6), which is sufficient flowability at ejection time, for example, and presents a good thermo-setting property during heating in the reflow step.

In the method of mounting an electronic component in accordance with the second invention differs from the above mentioned method in accordance with the first invention in the composition of the isotropic conductive adhesive to be used. Namely, the second invention uses the isotropic conductive adhesive for the connection of the electronic component to the printed circuit board, just like the method of mounting an electronic component in accordance with the first invention. Therefore the environmental problems caused by the lead component contained in solder paste can be prevented.

Also in the method of mounting an electronic component in accordance with the second invention, the ink jet type adhesive coating device is used, therefore the isotropic conductive adhesive can be supplied to the printed circuit board without going through the printing step using a metal mask, and the isotropic conductive adhesive can be supplied to the printed circuit board at an extremely small pitch. As a consequence a high-density fine-pitch electronic component can be connected on the printed circuit board.

Figure 7:
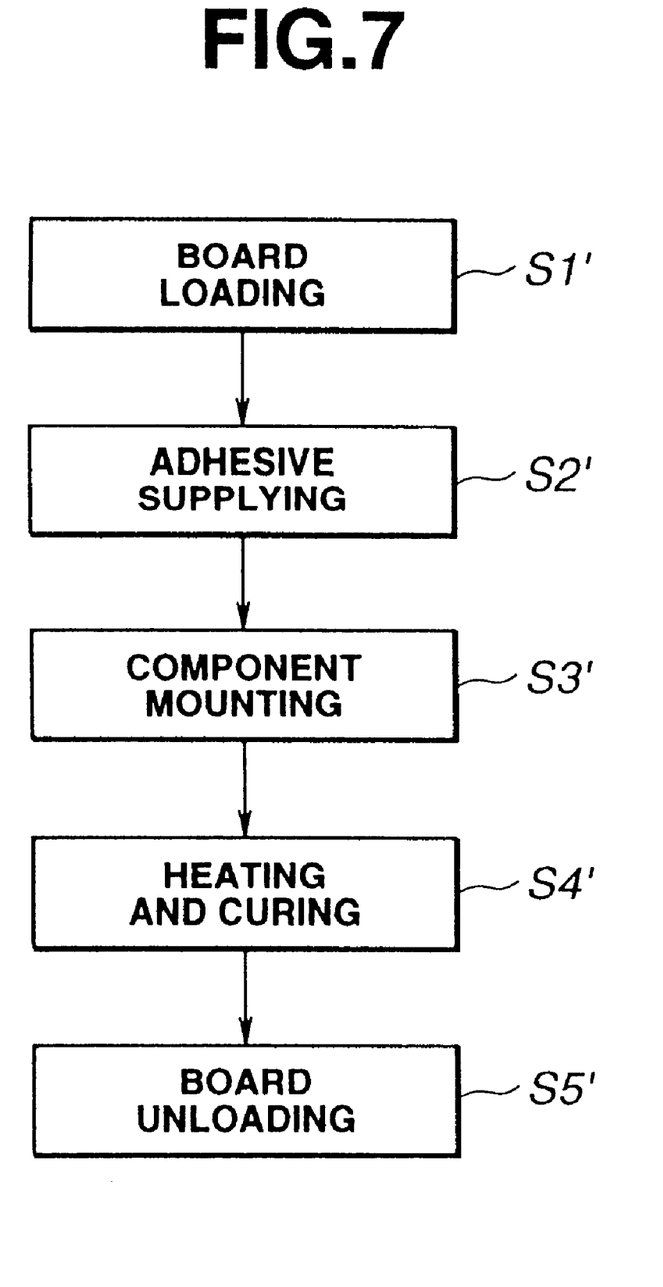
FIG. 7 is a flowchart indicating steps of a method of mounting an electronic component in accordance with the third invention.

The method of mounting an electronic component in accordance with the third invention, on the other hand, comprises a board loading step S1' where a printed circuit board is loaded from a magazine (not illustrated) in the mounting line of a product facility (not illustrated), a supply step S2' where an anisotropic conductive adhesive is supplied to electrodes on the printed circuit board, a mounting step S3' where an electronic component is mounted on a predetermined area of the printed circuit board, a reflow step S4' where the anisotropic conductive adhesive is heated and cured in a reflow furnace, and a board unloading step S5' where the printed circuit board on which the electronic component has been connected is unloaded to a magazine (not illustrated) as shown in FIG. 7.

Figure 8:
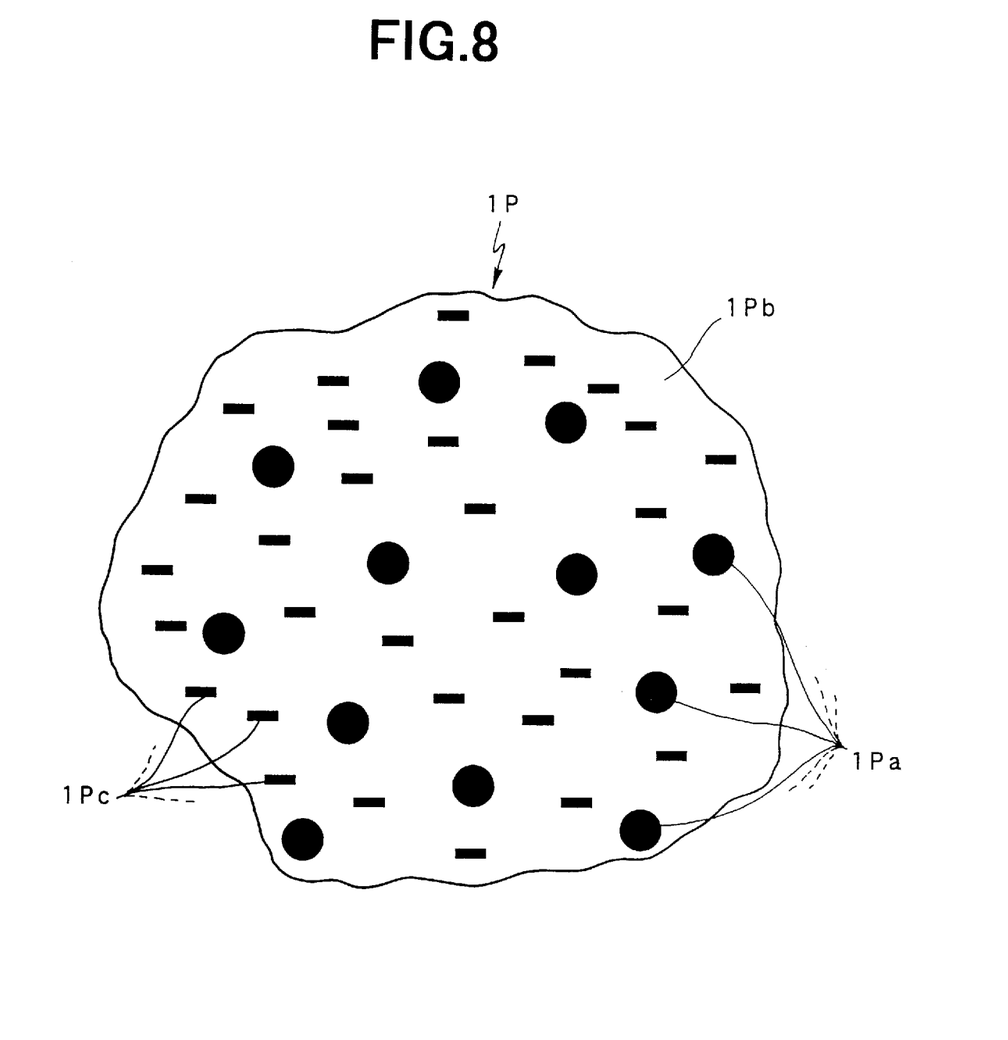
FIG. 8 is a schematic diagram depicting the anisotropic conductive adhesive used for the method of mounting an electronic component in accordance with the third invention.

As FIG. 8 shows, the anisotropic conductive adhesive 1P used in the supply step S2' comprises an epoxy resin-based paste type binder 1Pb mixed with many fillers 1Pa, 1Pa . . . And in the binder 1Pb, many condensing agents 1Pc, 1Pc . . . comprising small pieces of polyethylene fluoride fibers have been mixed.

The anisotropic conductive adhesive 1P has a nature to shrink and cure when it is heated in the reflow step S4' in such a way that leads of the electronic component and the electrodes on the printed circuit board are electrically and mechanically connected.

The materials of the binder 1Pb and the condensing agent 1Pc are not limited to the above mentioned epoxy resin and polyethylene fluoride fibers, and various materials can be used if the shrinking and curing required for connection between the printed circuit board and the electronic component can be obtained.

Needless to say, the mixing ratio of the condensing agent 1Pc to the binder 1Pb may also be set to an appropriate value within the range where the required shrinking and curing is satisfied.

Figure 9A:
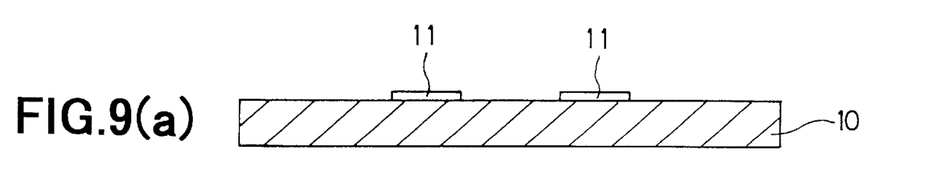
FIGS. 9(a) through 9(d) are schematic diagrams sequentially depicting the method of mounting an electronic component in accordance with the third invention.
Figure 9B:
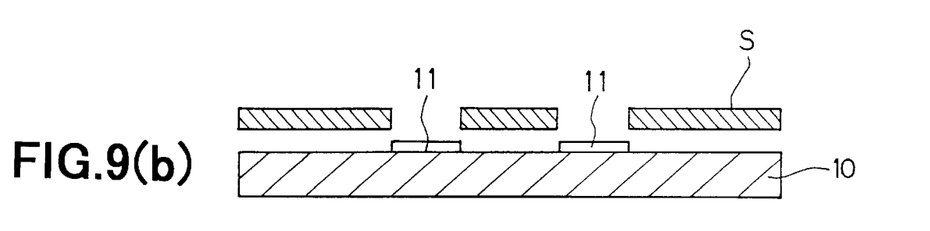
Figure 9C:
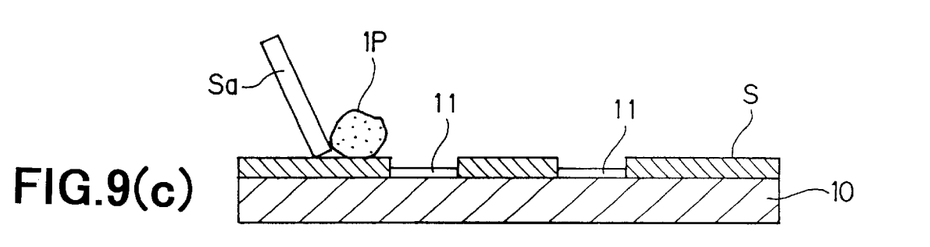
Figure 9D:
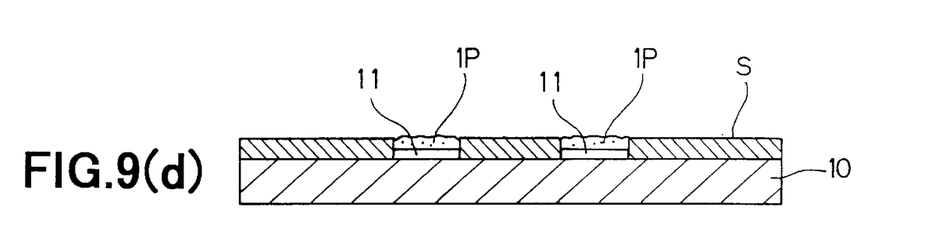

As FIG. 9(a) shows, the printed circuit board 10 is loaded into the mounting line in the board loading step S1' and in the supply step S2' shown in FIGS. 9(b) through 9(d), a metal mask S is set on the printed circuit board 10. Then the anisotropic conductive adhesive 1P is printed on the surface of the electrodes 11 by a squeegee Sa.

Figure 10A:
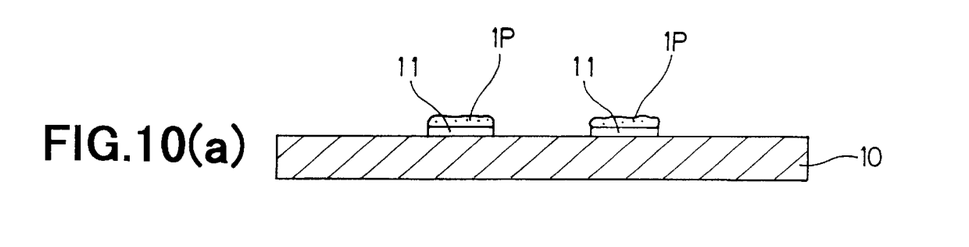
FIGS. 10(a) through 10(c) are schematic diagrams sequentially depicting the method of mounting an electronic component in accordance with the third invention.
Figure 10B:
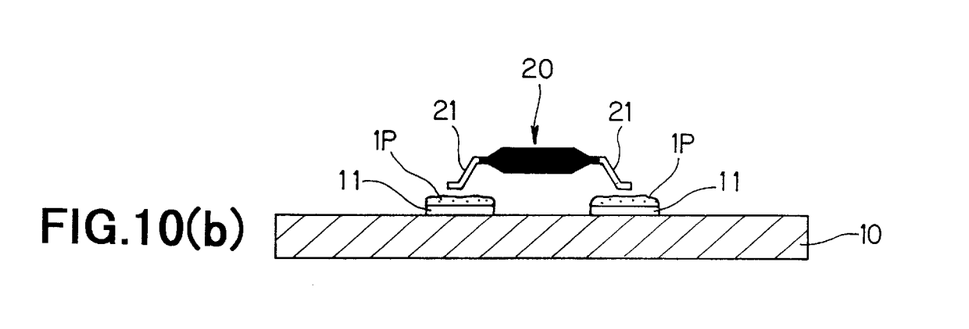

After the anisotropic conductive adhesive 1P is supplied to the electrodes 11 on the printed circuit board 10 as shown in FIG. 10(a), the leads 21 of the electronic component (high-density fine-pitch electronic component) 20 are placed on the electrodes 11 to which the anisotropic conductive adhesive 1P has been supplied in the mounting step S3' shown in FIG. 10(b), so as to mount the electronic component 20 at the predetermined position of the printed circuit board 10.

Figure 10C:
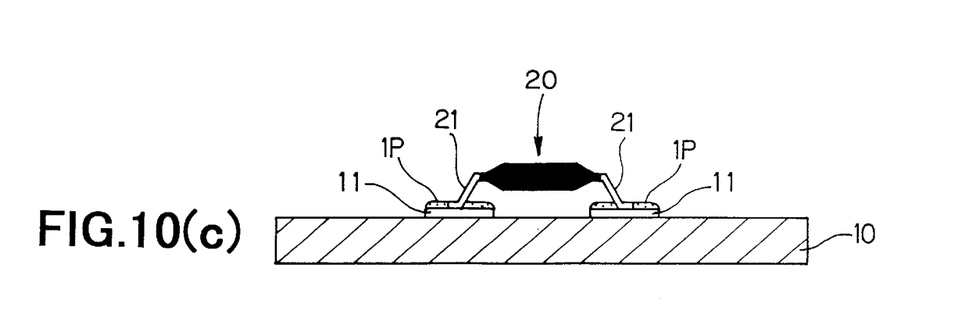

Then, in the reflow step S4' in FIG. 10(c), the printed circuit board 10 on which the electronic component 20 has been mounted is placed into the reflow furnace which is not illustrated, and the anisotropic conductive adhesive 1P is heated and cured in the reflow furnace, so that the electrodes 11 on the printed circuit board 10 and the leads 21 of the electronic component 20 are connected to each other.

The electrodes 11 on the printed circuit board 10 and the leads 21 of the electronic component is electrically and mechanically connected by shrinking and curing of the anisotropic conductive adhesive 1P heated in the reflow furnace.

In this way, the printed circuit board 10 and the electronic component 20 can be connected without pressurization if the anisotropic conductive adhesive 1P, which shrinks and cures by heating, is used so as to electrically and mechanically connect the electrodes 11 and the leads 21.

As a consequence, in the method of mounting an electronic component in accordance with the present invention, the printed circuit board 10 and the electronic component 20 can be connected using anisotropic conductive adhesive while utilizing a conventional reflow mounting type facility.

According to the present invention, the anisotropic conductive adhesive 1P is used for connection between the printed circuit board 10 and the electronic component 20, therefore a high-density fine-pitch electronic component can be connected on the printed circuit board.

The use of the anisotropic conductive adhesive 1P for connection between the printed circuit board 10 and the electronic component 20 also prevents the environmental problems caused by the lead component contained in solder paste.

In the reflow step S4', the anisotropic conductive adhesive 1P is heated from room temperature to a connection peak temperature (temperature at which strength required for connection is obtained) of the anisotropic conductive adhesive 1P, is then cooled down to room temperature, and in this embodiment, the connection peak temperature is set at 190° C. or less, which is lower than the heating temperature when solder paste is used (approximately 200° C.), and as a result the heat load to the printed circuit board 10 and the electronic component 20 can be decreased.

FIG. 11 shows another embodiment of the mounting method in accordance with the present invention. In this method of mounting an electronic component, a printed circuit board 10 is loaded into a mounting line as shown in FIG. 11(a), and anisotropic conductive adhesive 1P is supplied to electrodes 11 on the printed circuit board 10, as shown in FIG. 11(b), using a dispenser D as a delivery nozzle.

Figure 11A:
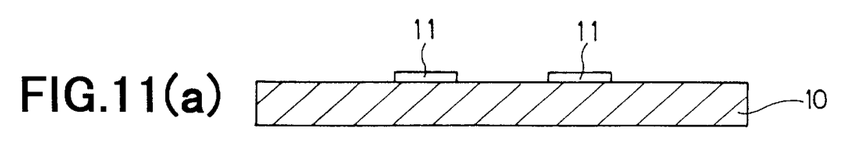
FIGS. 11(a) through 11(e) are schematic diagrams sequentially depicting the method of mounting an electronic component in accordance with the third invention.
Figure 11B:
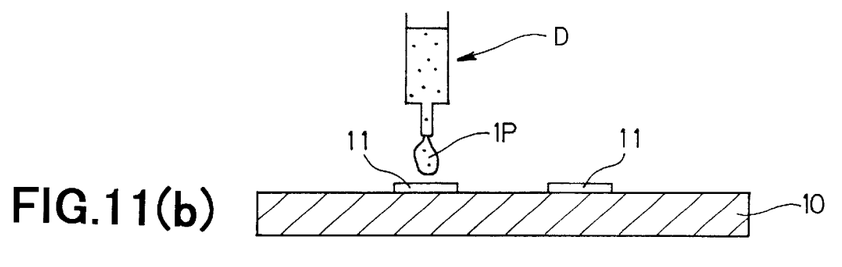
Figure 11C:
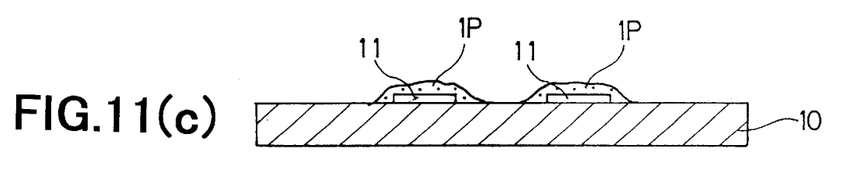
Figure 11D:
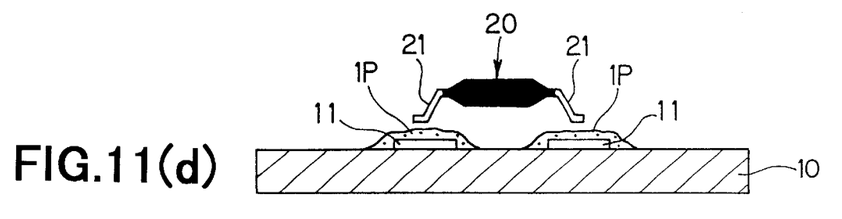

After the anisotropic conductive adhesive 1P is supplied to the electrodes 11, as shown in FIG. 11(c), leads 21 of the electronic component 20 are placed on the electrodes 11 to which the anisotropic conductive adhesive 1P has been supplied, so as to mount the electronic component 20 at a predetermined position of the printed circuit board 10, as shown in FIG. 11(d).

Figure 11E:
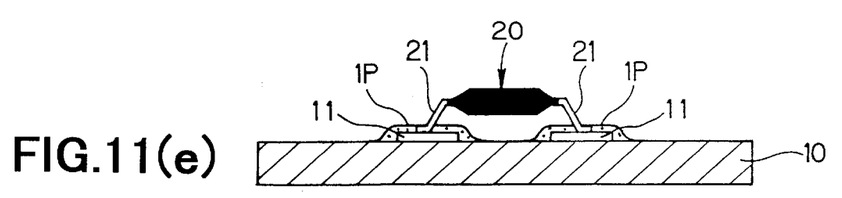

Then the anisotropic conductive adhesive 1P is heated in a reflow furnace, as shown in FIG. 11(e), and the anisotropic conductive adhesive 1P is shrunk and cured, so that the electrodes 11 on the printed circuit board 10 and the leads 21 of the electronic component 20 are connected to each other.

According to the above mentioned method of mounting an electronic component, where a coating method using a dispenser is adopted for the supply step, the supply step can be simpler and faster in addition to the effects as being achieved in the methods for mounting an electronic component shown in FIG. 9 and FIG. 10.

Figure 12:
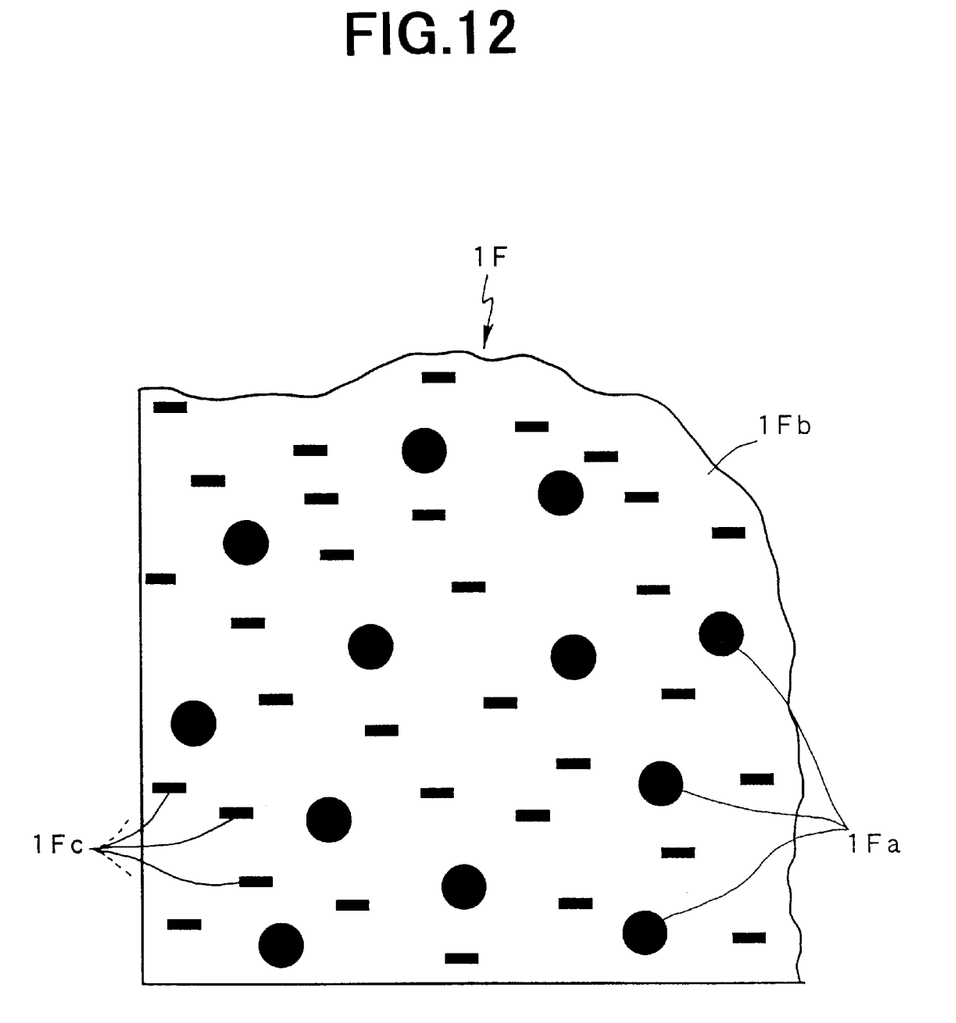
FIG. 12 is a schematic diagram depicting the anisotropic conductive adhesive used for the method of mounting an electronic component in accordance with the third invention.

FIG. 12 shows a film type anisotropic conductive adhesive 1F, where this anisotropic conductive adhesive 1F (hereafter called anisotropic conductive film 1F) is epoxy resin-based binder 1Fb mixed with many fillers 1Fa, 1Fa . . . formed into a film. In this film type binder 1Fb, many condensing agents 1Fc, 1Fc . . . comprising small pieces of polyethylene fluoride fibers have been mixed.

This anisotropic conductive film 1F also has a nature to shrink and cure when it is heated in the reflow step S4' in such a way that the leads of the electronic component and the electrodes on the printed circuit board are electrically and mechanically connected, just like the above mentioned paste type anisotropic conductive adhesive 1P.

Needless to say, the materials of the binder 1Fb and the condensing agent 1Fc, and the mixing ratio of the condensing agent 1Fc to the binder 1Fc can be set appropriately in a range where the required characteristics are satisfied, just like the case of the paste type anisotropic conductive adhesive 1P.

Figure 13A:
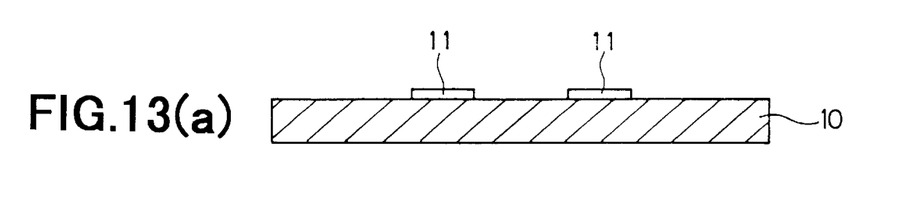
FIGS. 13(a) through 13(d) are schematic diagrams sequentially depicting the method of mounting an electronic component in accordance with the third invention.
Figure 13B:
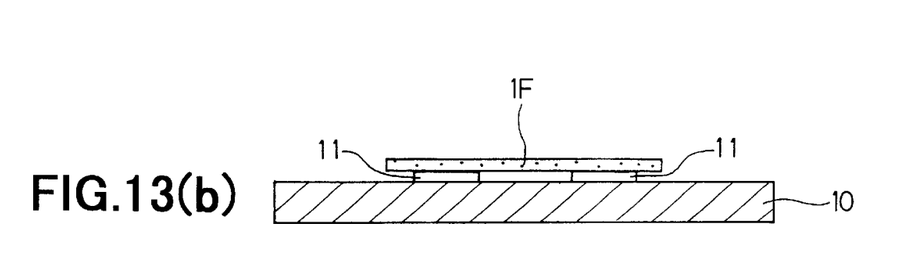

FIG. 13 shows the method of mounting an electronic component using the anisotropic conductive film 1F, where the printed circuit board 10 is loaded into the mounting line as shown in FIG. 13(a), and the anisotropic conductive film 1F is placed on the electrodes 11 as shown in FIG. 13(b).

Figure 13C:
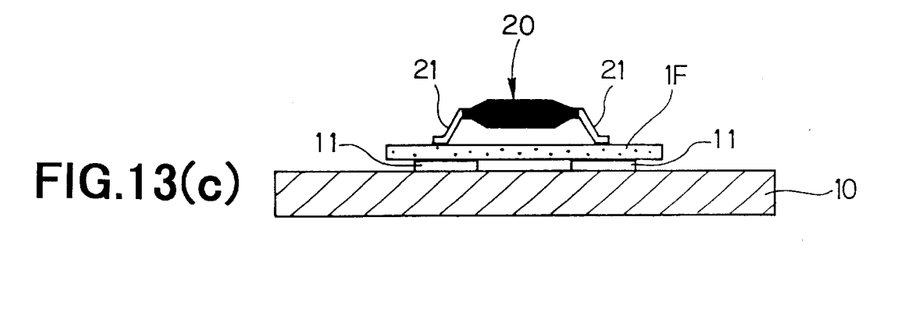

After this, the leads 21 of the electronic component (high-density fine-pitch electronic component) 20 are placed on the electrodes 11 on which the anisotropic conductive film 1F has been placed, as shown in FIG. 13(c), and the electronic component 20 is mounted at a predetermined position of the printed circuit board 10.

Figure 13D:
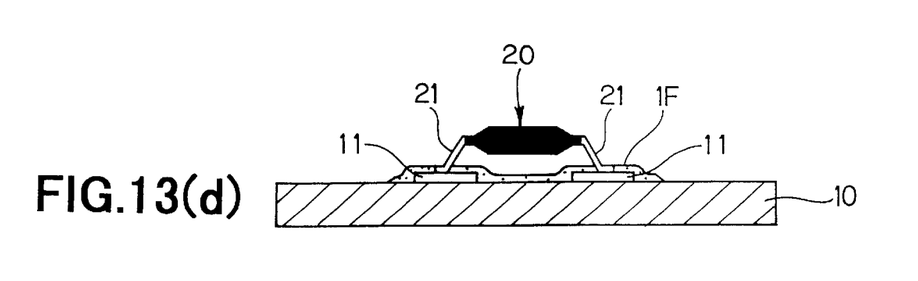

Then, as shown in FIG. 13(d), the anisotropic conductive film 1F is heated in the reflow furnace, and the melted anisotropic conductive film 1F is shrunk and cured, so that the electrodes 11 on the printed circuit board 10 and the leads 21 on the electronic component 20 are connected to each other.

According to the above mentioned method of mounting an electronic component, where the supply step is completed by placing the anisotropic conductive film 1F on the electrodes 11, the supply step can be much simpler and faster, in addition to the effects obtained in the methods for mounting an electronic component shown in FIG. 9 and FIG. 10.

The above mentioned embodiments illustrated an example in which the electronic component has leads protruding from the package and these leads are connected to the electrodes on the printed circuit board. However, needless to say, the method of mounting an electronic component in accordance to the present invention can also be effectively applied to a flip-chip connection system, where a bare IC chip is directly mounted onto a printed circuit board.

What is claimed is:

1. A method of mounting an electronic component by connecting leads of an electronic component and electrodes of a printed circuit board comprising the steps of:
   supplying the printed circuit board with an anisotropic conductive adhesive which comprises a resin-based binder mixed with filler and fiber which shrinks by heating, wherein shrinking of the fiber by heating causes the resin-based binder to shrink and cure so as to electrically and mechanically connect the leads and the electrodes;
   mounting the electronic component on the printed circuit board via the anisotropic conductive adhesive; and
   electrically and mechanically connecting the leads of the electronic component to the electrodes of the printed circuit board solely by heating the anisotropic conductive adhesive, wherein the connecting is directly subsequent to the mounting of the electronic component on the printed circuit board.

2. The method of mounting an electronic component according to claim 1, wherein the anisotropic conductive adhesive is of paste type and the paste type anisotropic conductive adhesive is supplied to the electrodes on the printed circuit board by printing using a mask.

3. The method of mounting an electronic component according to claim 1, wherein the anisotropic conductive adhesive is of paste type and the paste type anisotropic conductive adhesive is supplied to the electrodes on the printed circuit board by coating using a dispenser.

4. The method of mounting an electronic component according to claim 1, wherein the anisotropic conductive adhesive is of film-shaped form and the film-shaped anisotropic conductive adhesive is supplied to the electrodes on the printed circuit board by placing on the electrodes.

5. The method of mounting an electronic component according to claim 1, wherein the anisotropic conductive adhesive is heated in a reflow furnace.

* * * * *